United States Patent
Nugent et al.

(10) Patent No.: US 10,313,772 B2
(45) Date of Patent: Jun. 4, 2019

(54) SPEAKER ACCESSORY MOUNTING BRACKET

(71) Applicant: Harman International Industries Incorporated, Stamford, CT (US)

(72) Inventors: Timothy M. Nugent, Venice, CA (US); Craig A. Lambrecht, Granger, IN (US)

(73) Assignee: Harman International Industries, Incorporated, Stamford, CT (US)

(*) Notice: Subject to any disclaimer, the term of this patent is extended or adjusted under 35 U.S.C. 154(b) by 0 days.

(21) Appl. No.: 15/869,945

(22) Filed: Jan. 12, 2018

(65) Prior Publication Data

US 2018/0206016 A1 Jul. 19, 2018

Related U.S. Application Data

(60) Provisional application No. 62/446,081, filed on Jan. 13, 2017.

(51) Int. Cl.
| | |
|---|---|
| *H04R 1/02* | (2006.01) |
| *F16M 11/04* | (2006.01) |
| *H05K 5/02* | (2006.01) |
| *F21V 33/00* | (2006.01) |
| *G03B 17/56* | (2006.01) |
| *F16M 13/02* | (2006.01) |

(52) U.S. Cl.
CPC ........... *H04R 1/028* (2013.01); *F16M 11/041* (2013.01); *F16M 13/022* (2013.01); *F21V 33/0056* (2013.01); *G03B 17/561* (2013.01); *H05K 5/0204* (2013.01); *H05K 5/0217* (2013.01); *H04R 1/026* (2013.01)

(58) Field of Classification Search
CPC .......... H04R 1/02; H04R 1/026; H04R 1/028; H04R 1/16; H05K 5/0204; H05K 5/0217; F16M 11/041; F21V 33/0056; G03B 17/561
USPC ........ 381/332, 333, 361, 362, 363, 379, 386
See application file for complete search history.

(56) References Cited

U.S. PATENT DOCUMENTS

| | | | |
|---|---|---|---|
| 2011/0062299 A1* | 3/2011 | Tsai ..................... | F16M 11/041 248/231.41 |
| 2011/0262244 A1* | 10/2011 | Marlow ............... | B60Q 1/2634 411/360 |
| 2015/0305518 A1* | 10/2015 | Galant ................. | F16M 11/041 248/551 |
| 2015/0358734 A1* | 12/2015 | Butler ..................... | H04R 3/12 381/59 |

OTHER PUBLICATIONS

SureTones, QSC K10 with ADJ Mega Par Pro, 2012, p. 1-2.*
JBL, Harman International Industries, "EON ONE All-In-One Linear Array P.A. System", 2016, www.jblpro.com.

* cited by examiner

*Primary Examiner* — William A Jerez Lora
(74) *Attorney, Agent, or Firm* — Brooks Kushman P.C.

(57) ABSTRACT

An audio system is provided with a housing and at least one audio transducer that is supported by the housing. The housing includes an external surface with at least one of an aperture formed into the external surface and a post extending along an axis. The audio system is also provided with a base for supporting an accessory with at least another of the aperture and the post in cooperation with the at least one of the aperture and the post of the housing to connect the base to the housing.

12 Claims, 7 Drawing Sheets

SPEAKER ACCESSORY MOUNTING BRACKET

CROSS-REFERENCE TO RELATED APPLICATIONS

This application claims the benefit of U.S. provisional application Ser. No. 62/446,081 filed Jan. 13, 2017, the disclosure of which is hereby incorporated in its entirety by reference herein.

TECHNICAL FIELD

One or more embodiments relate to a mounting bracket for mounting an accessory to a speaker assembly.

BACKGROUND

Devices for supporting cameras and video equipment at an elevated position are known. For example, a tripod may be used for supporting cameras and video equipment at an elevated position.

SUMMARY

In one embodiment, a speaker assembly is provided with a housing and at least one audio transducer that is supported by the housing. The housing has an external surface with an aperture formed therein. The speaker assembly is also provided with a mounting bracket with a base for supporting an accessory and a post extending from the base and sized to be received by the aperture of the housing for connecting the base to the housing.

In another embodiment, an audio system is provided with a housing and at least one audio transducer that is supported by the housing. The housing includes an external surface with at least one of an aperture formed into the external surface and a post extending along an axis. The audio system is also provided with a base for supporting an accessory with at least another of the aperture and the post in cooperation with the at least one of the aperture and the post of the housing to connect the base to the housing.

In yet another embodiment, a mounting bracket is provided with a base with a first side and a second side that is opposite the first side, and a post extending transversely from the first side. The mounting bracket is also provided with a pair of projections extending from the second side of the base and latterly spaced apart from each other to define a channel for receiving a portion of an accessory.

In another embodiment, a media device is provided with a housing and at least one audio transducer that is supported by the housing. The housing includes a first surface and a second surface longitudinally spaced apart from the first surface. The first surface is adapted to rest upon an underlying surface, and an aperture is formed into the second surface and extends along a longitudinal axis. The aperture is sized to receive a portion of a mounting bracket for coupling an accessory to the housing.

As such the mounting bracket utilizes the height of the speaker assembly to provide a convenient location to mount an accessory (e.g., a camera) at an elevated position, without requiring additional support structure, e.g., a tripod.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
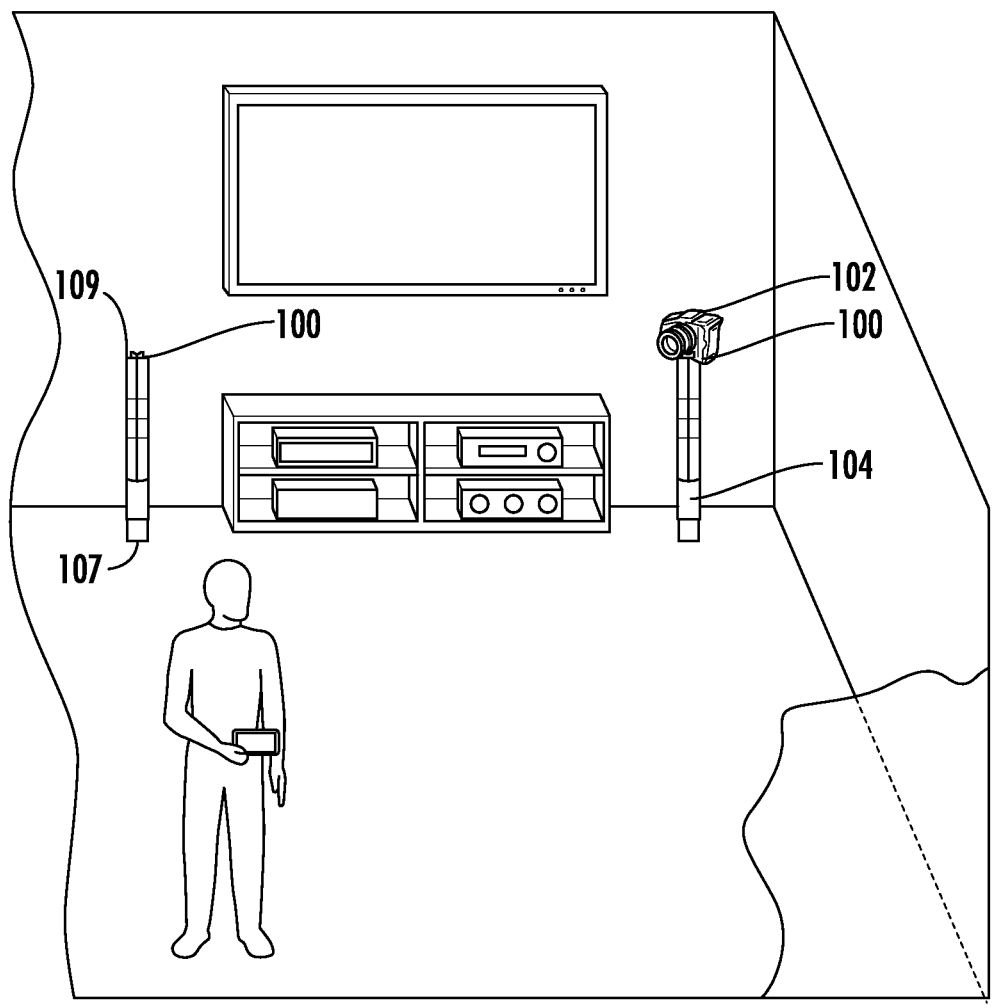
FIG. 1 is a front perspective view of a home audio system including a speaker assembly with a mounting bracket for mounting a camera to the speaker assembly, according to one or more embodiments.

With reference to FIG. 1, a mounting bracket is illustrated in accordance with one or more embodiments and generally illustrated by numeral 100. The mounting bracket 100 supports an accessory, such as a camera 102 and mounts to a media device, such as a speaker assembly 104. The mounting bracket 100 utilizes the height of the speaker assembly 104 to provide a convenient location to mount the camera 102 at an elevated position, without requiring additional support structure, e.g., a tripod. Although shown mounted to the top surface of the speaker assembly 104, other embodiments of the mounting bracket 100 contemplate mounting to a side surface of the speaker assembly 104, or mounting to other media devices, such as a television.

Figure 2:
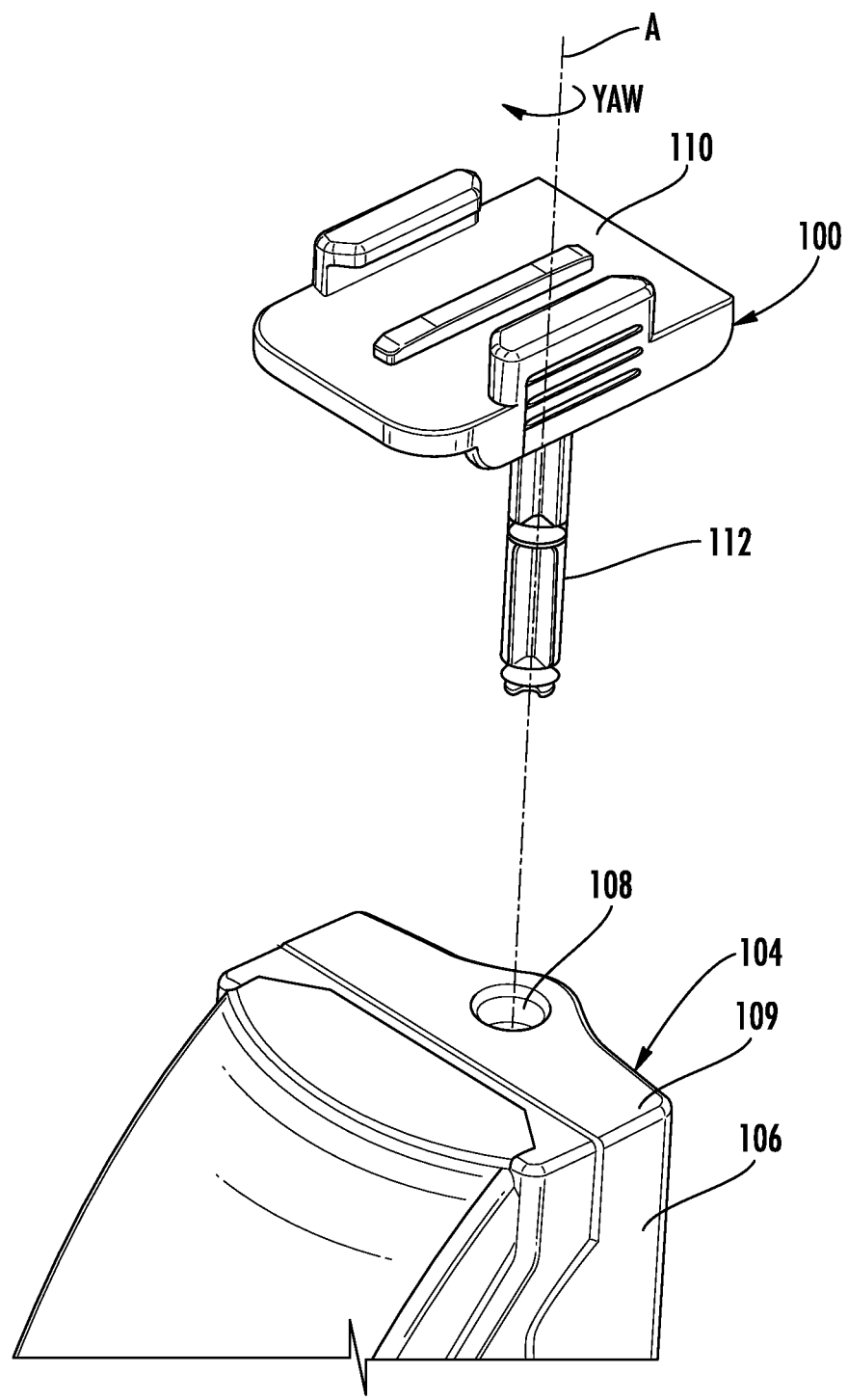
FIG. 2 is a top perspective exploded view of the mounting bracket and the speaker assembly of FIG. 1.

Referring to FIG. 2, the mounting bracket 100 mechanically connects to the speaker assembly 104. The speaker assembly 104 includes a housing 106 that supports at least one audio transducer (not shown). In one embodiment, the housing 106 supports at least three transducers including: a low-frequency transducer (e.g., a subwoofer), a mid-range transducer, and a high-frequency transducer (e.g., a tweeter). In another embodiment, the speaker assembly 104 is a multiple channel linear-array PA System, such as the EON ONE PRO by JBL®. The housing 106 includes a lower surface 107 (shown in FIG. 1) for resting on an underlying surface. The housing 106 includes an aperture 108 that is formed into an upper surface 109 and extends along a longitudinal axis A. The lower surface 107 is longitudinally spaced apart from the upper surface 109 along the axis A. The mounting bracket 100 includes a base 110 for supporting the camera 102 (shown in FIG. 1). The mounting bracket 100 also includes a post 112 that extends transversely from the base 110. The post 112 is received within the aperture 108 of the speaker assembly 104 for mechanically connecting the mounting bracket 100 to the speaker assembly 104. The post 112 allows the mounting bracket 100 to rotate about axis A, so that user can adjust a yaw angle of the camera 102 relative to the speaker assembly 104. Other embodiments of the mounting bracket 100 contemplate alternative features for connecting to the speaker assembly, e.g., threaded fasteners, clips and magnets. Other embodiments contemplate a post that extends from the housing 106 and is received by an aperture formed in the mounting bracket (not shown).

Figure 3:
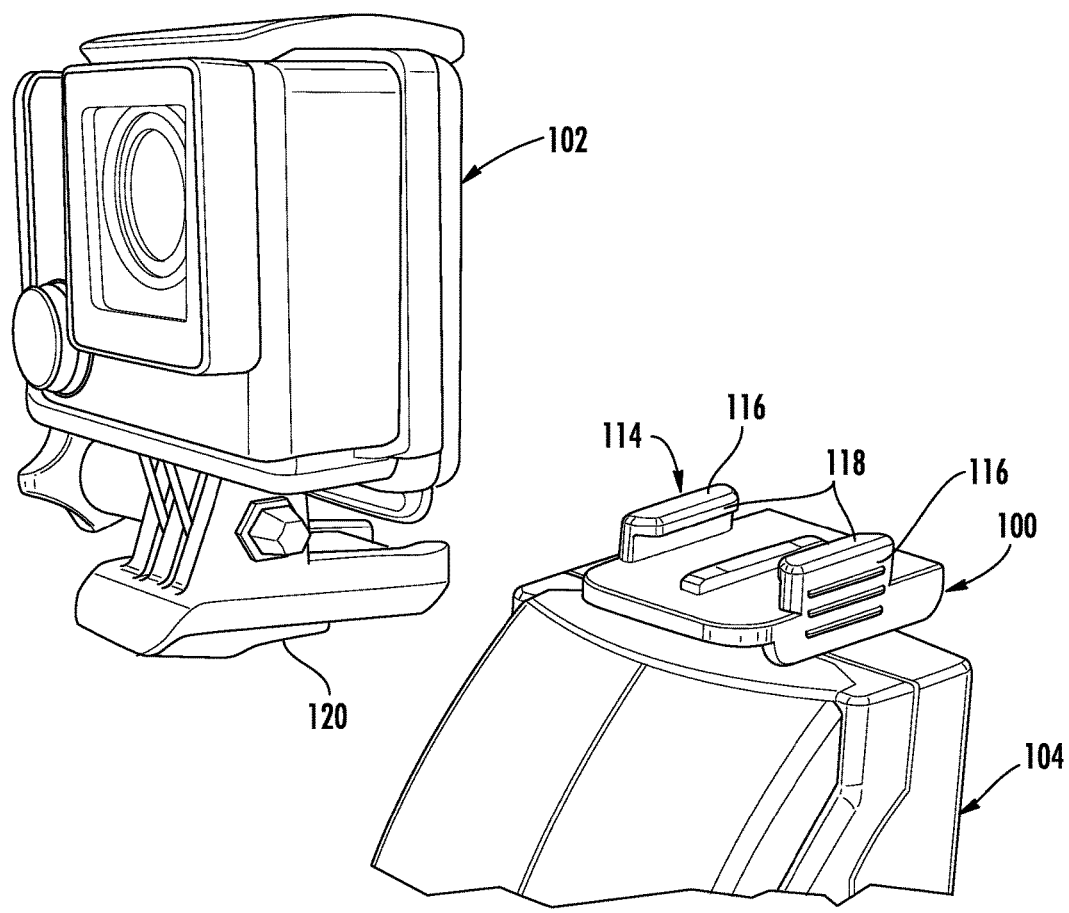
FIG. 3 is a top perspective exploded view of the camera and the speaker assembly of FIG. 1.
Figure 4:
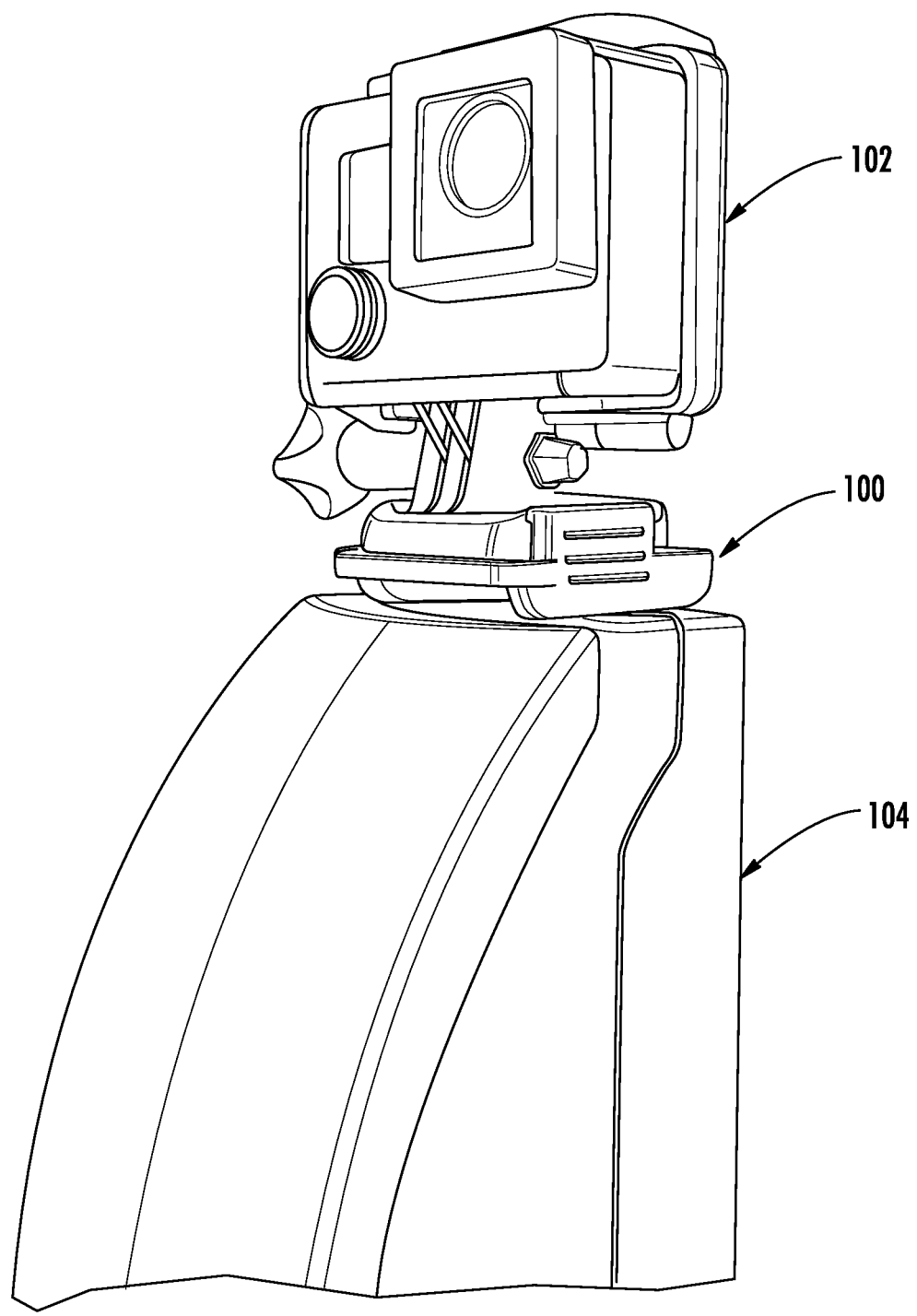
FIG. 4 is a front perspective view of the speaker assembly and camera of FIG. 1.
Figure 5:
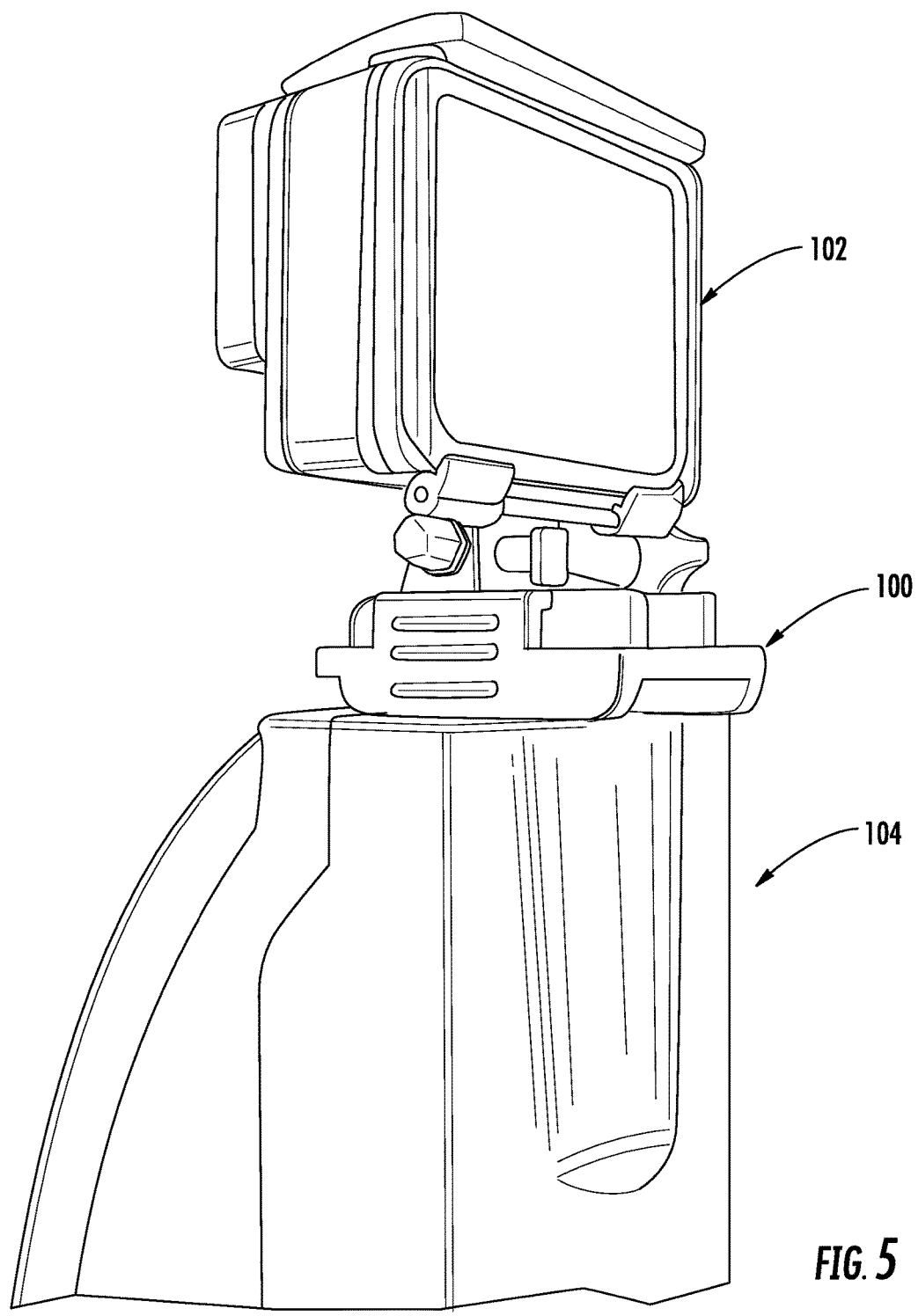
FIG. 5 is a rear perspective view of the speaker assembly and camera of FIG. 1.

With reference to FIGS. 3-5, the mounting bracket 100 includes a retainer 114 to engage the accessory (camera) 102. The retainer 114 includes a pair of projections 116 that extend from the base 110 and are laterally spaced apart from each other, according to the illustrated embodiment. Each projection 116 includes a tab 118 that extends inward and towards the other projection 116 to define a channel. The camera 102 is connected to a bracket 120 that includes a base that is captured in the channel between the projections 116 of the mounting bracket 100, for mounting the camera 102 to the speaker assembly 104. Other embodiments of the mounting bracket 100 include a retainer 114 designed to engage alternative accessories, such as a light, sign or decoration (not shown).

Figure 6:
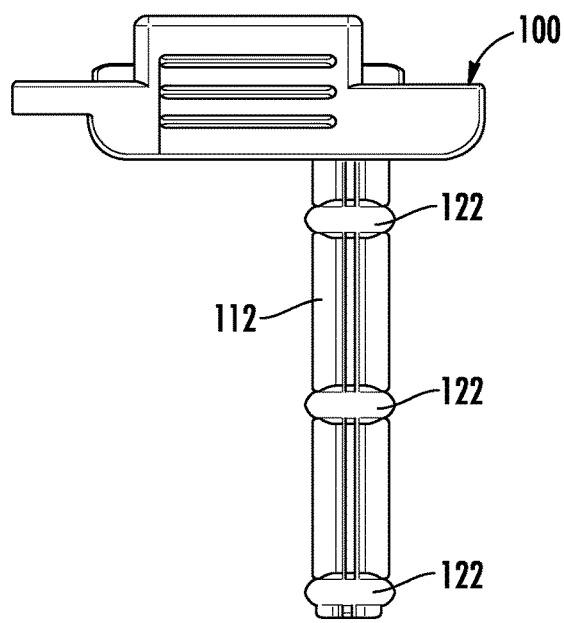
FIG. 6 is a side elevation view of the mounting bracket of FIG. 1.
Figure 7:
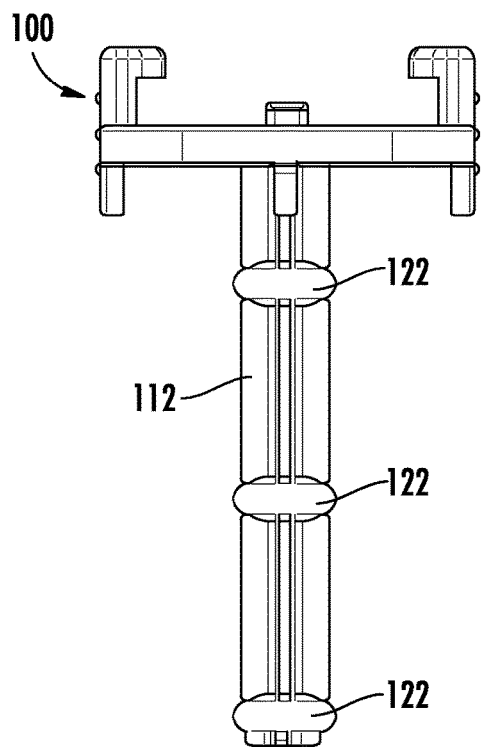
FIG. 7 is a front elevation view of the mounting bracket of FIG. 1.
Figure 8:
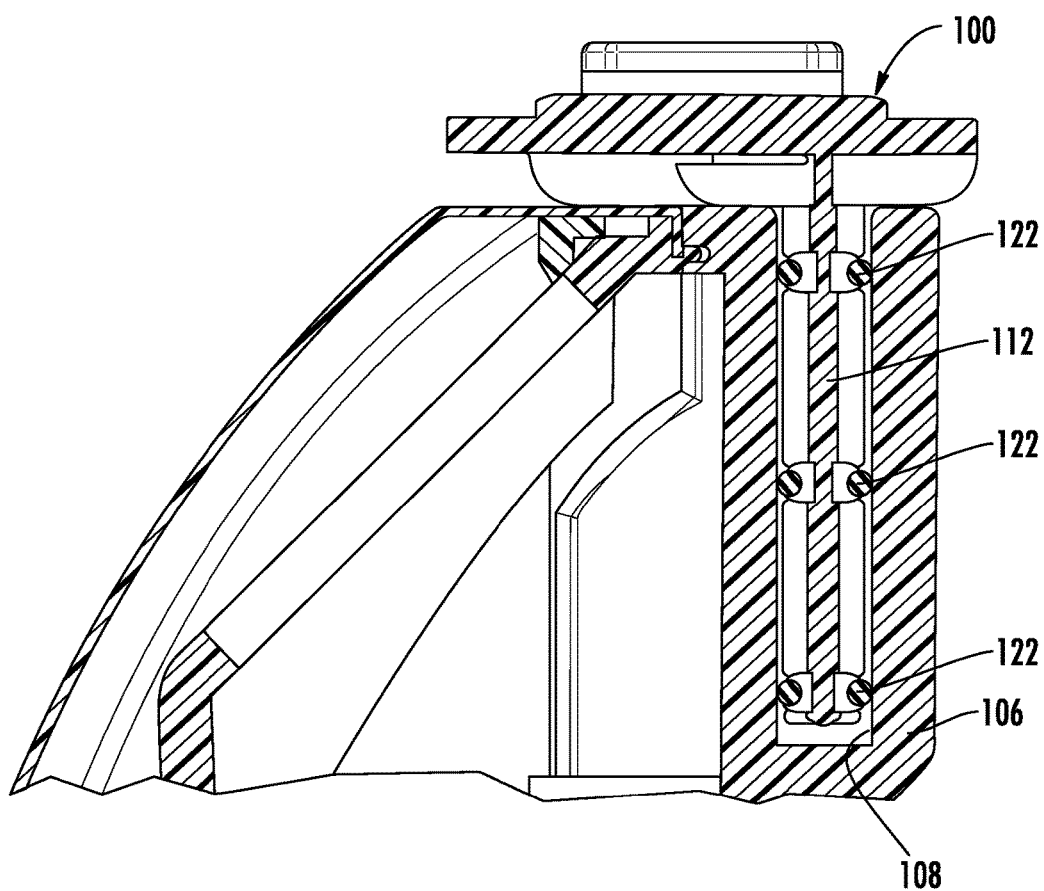
FIG. 8 is a vertical section view of the speaker assembly and mounting bracket of FIG. 3.

Referring to FIGS. 6-8, the mounting bracket 100 connects to the speaker assembly 104 with an interference or friction fit, according to one embodiment. The mounting bracket 100 includes flexible members 122, such as O-rings, that are connected to the post 112. As shown in FIGS. 6-7, the outer diameters of the O-rings 122 are greater than the outer diameter of the post 112. However, as shown in FIG. 8, the inner diameter of the aperture 108 formed into the speaker housing 106 is greater than the outer diameter of the post 112, but smaller than the outer diameters of the O-rings 122, which provides an interference fit. The speaker assembly 104 vibrates when it provides sound, but the O-rings 122 absorb the vibration to limit any noise (e.g., buzz, squeak and rattle) between the housing 106 and the mounting bracket 100. The interference fit also limits rotation of the mounting bracket 100 and camera 102 while the speaker assembly 104 is providing sound. Other embodiments of the mounting bracket 100 contemplate a post 112 that is overmolded with flexible material, or a post 112 that includes overmolded material and one or more O-rings.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An audio system comprising:
    a housing with an external surface having an aperture formed into the external surface;
    at least one audio transducer supported by the housing;
    a base for supporting an accessory with a post extending along an axis in cooperation with the aperture of the housing to connect the base to the housing; and
    a plurality of flexible members coupled to the post and adapted to engage the housing within the aperture, wherein the flexible members are formed in an annular shape with an inner diameter sized to receive the post and an outer diameter that, when uncompressed, is larger than a diameter of the aperture to provide an interference fit.

2. The audio system of claim 1 wherein the external surface of the housing comprises a first surface and a second surface spaced apart from the first surface along the axis, wherein the first surface is adapted to rest upon an underlying surface and the aperture is formed into the second surface.

3. The audio system of claim 1 wherein the base further comprises a retainer extending from the base for engaging the accessory.

4. The audio system of claim 1 wherein the at least one audio transducer comprises at least one high-frequency transducer.

5. An audio system comprising:
    a mounting bracket including:
        a base with a first side and a second side opposite the first side;
        a post extending transversely from the first side;
        a plurality of flexible members coupled to the post; and
        a pair of projections extending from the second side of the base and laterally spaced apart from each other to define a channel for receiving a portion of an accessory;
    a housing with an external surface and an aperture formed into the external surface and sized to receive the post; and
    at least one audio transducer supported by the housing;
    wherein the flexible members are adapted to engage the housing within the aperture, wherein the flexible members are formed in an annular shape with an inner diameter sized to receive the post and an outer diameter that, when uncompressed, is larger than a diameter of the aperture to provide an interference fit.

6. The audio system of claim 5 wherein the external surface of the housing comprises a first surface and a second surface longitudinally spaced apart from the first surface, wherein the first surface is adapted to rest upon an underlying surface and the aperture is formed into the second surface.

7. The audio system of claim 5 further comprising a pair of tabs, each tab extending inward from a distal end of one of the projections toward the other tab for engaging the accessory.

8. A media device comprising:
    a housing with a first surface and a second surface longitudinally spaced apart from the first surface, wherein the first surface is adapted to rest upon an underlying surface and an aperture is formed into the second surface and extends along an axis;
    a mounting bracket having a base for supporting an accessory and a post extending from the base and sized to be received by the aperture of the housing for connecting the mounting bracket to the housing;
    at least one audio transducer supported by the housing; and
    a plurality of flexible members coupled to the post and adapted to engage the housing within the aperture, wherein the flexible members are formed in an annular shape with an inner diameter sized to receive the post and an outer diameter that, when uncompressed, is larger than a diameter of the aperture to provide an interference fit.

9. The media device of claim 8 wherein the base further comprises a retainer to engage the accessory.

10. The media device of claim 9 wherein the retainer further comprises a pair of projections extending from the base and laterally spaced apart from each other to define a channel for receiving a portion of the accessory.

11. The media device of claim 8 wherein the accessory comprises a camera.

12. The media device of claim 8 wherein the accessory comprises a light.

\* \* \* \* \*